United States Patent
Sawabe et al.

(10) Patent No.: US 10,534,260 B2
(45) Date of Patent: Jan. 14, 2020

(54) PATTERN FORMATION METHOD

(71) Applicant: Toshiba Memory Corporation, Tokyo (JP)

(72) Inventors: Tomoaki Sawabe, Tokyo (JP); Shinobu Sugimura, Kanagawa (JP); Koji Asakawa, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/101,547

(22) Filed: Aug. 13, 2018

(65) Prior Publication Data

US 2019/0121232 A1    Apr. 25, 2019

(30) Foreign Application Priority Data

Oct. 20, 2017   (JP) .................. 2017-203482

(51) Int. Cl.
*H01L 21/027* (2006.01)
*G03F 7/00* (2006.01)
(Continued)

(52) U.S. Cl.
CPC ............ *G03F 7/0002* (2013.01); *C03C 17/22* (2013.01); *C03C 17/30* (2013.01); *C09C 1/3081* (2013.01);
(Continued)

(58) Field of Classification Search
CPC ... G03F 7/0002; G03F 7/075; H01L 21/3086; H01L 21/3081; H01L 21/3065;
(Continued)

(56) References Cited

U.S. PATENT DOCUMENTS 8,017,234 B2    9/2011  Jin et al.
8,900,467 B1    12/2014 Chapuis et al.
(Continued)

FOREIGN PATENT DOCUMENTS

JP          4469002 B2      3/2010
JP       2011-159904 A      8/2011
(Continued)

*Primary Examiner* — Lan Vinh
(74) *Attorney, Agent, or Firm* — Finnegan, Henderson, Farabow, Garrett & Dunner, L.L.P.

(57) ABSTRACT

According to one embodiment, a pattern formation method can include performing a first processing of causing a surface of a first member of a processing body to be hydrophobic. The processing body includes the first member and a second member. The second member is provided at a portion of the first member. The method can include performing a second processing of causing the processing body to contact an atmosphere including a metal compound. The second processing is after the first processing. The method can include performing a third processing of processing the processing body in an atmosphere including at least one selected from the group consisting of water, oxygen, and ozone. The third processing is after the second processing. In addition, the method can include removing, after the third processing, at least a portion of another portion of the first member by using the second member as a mask.

21 Claims, 3 Drawing Sheets

(51) Int. Cl.
*H01L 21/308* (2006.01)
*H01L 21/3065* (2006.01)
*G03F 7/075* (2006.01)
*C09C 1/30* (2006.01)
*C03C 17/22* (2006.01)
*C03C 17/30* (2006.01)
*H01L 21/3105* (2006.01)
*H01L 21/033* (2006.01)

(52) U.S. Cl.
CPC .......... *G03F 7/075* (2013.01); *H01L 21/0271* (2013.01); *H01L 21/0273* (2013.01); *H01L 21/0337* (2013.01); *H01L 21/3065* (2013.01); *H01L 21/3081* (2013.01); *H01L 21/3086* (2013.01); *H01L 21/31058* (2013.01); *C03C 2217/76* (2013.01)

(58) Field of Classification Search
CPC ............. H01L 21/0273; H01L 21/0271; H01L 21/0337; H01L 21/31058; C03C 17/30; C03C 17/22; C03C 2217/76; C03B 33/12; C09C 1/3081
USPC ....... 438/706, 712, 714, 717, 723, 736, 756, 438/725
See application file for complete search history.

(56) References Cited

U.S. PATENT DOCUMENTS

| | | | |
|---|---|---|---|
| 8,980,418 B2 | 3/2015 | Darling et al. | |
| 2002/0173116 A1* | 11/2002 | Apyama | H01L 21/76801 438/424 |
| 2004/0166666 A1* | 8/2004 | Usami | H01L 21/76811 438/629 |
| 2005/0118762 A1* | 6/2005 | Nakamura | H01L 21/32136 438/253 |
| 2010/0124818 A1* | 5/2010 | Lee | H01L 21/823807 438/589 |
| 2011/0207319 A1* | 8/2011 | Imada | H01L 21/3105 438/653 |
| 2012/0126372 A1* | 5/2012 | Kozawa | G03F 7/40 257/618 |
| 2014/0202984 A1* | 7/2014 | Quesada | G03F 7/0002 216/11 |
| 2016/0251539 A1 | 9/2016 | Hustad et al. | |
| 2018/0138048 A1 | 5/2018 | Sawabe et al. | |

FOREIGN PATENT DOCUMENTS

| | | |
|---|---|---|
| JP | 2013-179218 A | 9/2013 |
| JP | 2016-160431 A | 9/2016 |
| JP | 2018-82033 A | 5/2018 |

* cited by examiner

PATTERN FORMATION METHOD

CROSS-REFERENCE TO RELATED APPLICATIONS

This application is based upon and claims the benefit of priority from Japanese Patent Application No. 2017-203482, filed on Oct. 20, 2017; the entire contents of which are incorporated herein by reference.

FIELD

Embodiments described herein relate generally to a pattern formation method.

BACKGROUND

For example, a fine pattern is formed in the manufacturing of an electronic device such as a semiconductor device, etc. High accuracy of the pattern formation method is desirable.

DETAILED DESCRIPTION

According to one embodiment, a pattern formation method is disclosed. The method can include performing a first processing of causing a surface of a first member of a processing body to be hydrophobic. The processing body includes the first member and a second member. The second member is provided at a portion of the first member. The method can include performing a second processing of causing the processing body to contact an atmosphere including a metal compound. The second processing is after the first processing.

The method can include performing a third processing of processing the processing body in an atmosphere including at least one selected from the group consisting of water, oxygen, and ozone. The third processing is after the second processing. In addition, the method can include removing, after the third processing, at least a portion of another portion of the first member by using the second member as a mask.

According to another embodiment, a pattern formation method is disclosed. The method can include performing a first processing of a surface of a first member of a processing body by using a compound including fluorine. The processing body includes the first member and a second member. The second member is provided at a portion of the first member. The method can include performing a second processing of causing the processing body to contact an atmosphere including a metal compound. The second processing is after the first processing. The method can include performing a third processing of performing processing in an atmosphere including at least one selected from the group consisting of water, oxygen, and ozone. The third processing is after the second processing. In addition, the method can include removing, after the third processing, at least a portion of another portion of the first member by using the second member as a mask.

According to another embodiment, a pattern formation method is disclosed. The method can include performing a first processing of a surface of a first member of a processing body by using a compound including at least one selected from the group consisting of alkyldisilazane, and alkylchlorosilane. The processing body includes the first member and a second member. The second member is provided at a portion of the first member. The method can include performing a second processing of causing the processing body to contact an atmosphere including a metal compound. The second processing is after the first processing. The method can include performing a third processing of performing processing in an atmosphere including at least one selected from the group consisting of water, oxygen, and ozone. The third processing is after the second processing. In addition, the method can include removing, after the third processing, at least a portion of another portion of the first member by using the second member as a mask.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1A to FIG. 1F are schematic cross-sectional views illustrating a pattern formation method according to a first embodiment.

Figure 2:
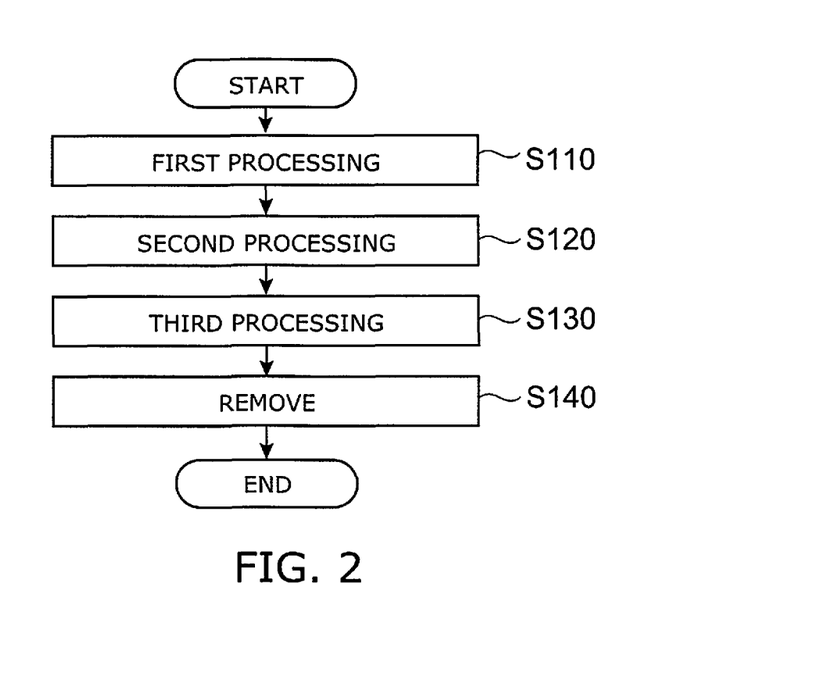
FIG. 2 is a flowchart illustrating the pattern formation method according to the first embodiment.

FIG. 2 is a flowchart illustrating the pattern formation method according to the first embodiment.

Figure 1A:
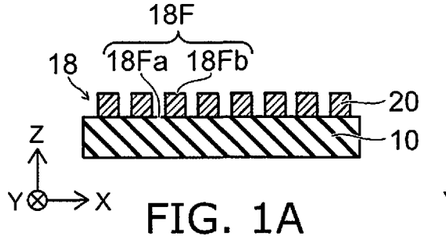
FIG. 1A to FIG. 1F are schematic cross-sectional views illustrating a pattern formation method according to a first embodiment.

A processing body 18 is prepared as shown in FIG. 1A. The processing body 18 includes a first member 10 and a second member 20. The second member 20 is provided at a portion of the first member 10. Another portion of the first member is not covered with the second member 20.

The first member 10 is, for example, a substrate. The first member 10 is, for example, an inorganic substance. The first member 10 includes, for example, at least one selected from the group consisting of silicon, silicon oxide, silicon nitride, silicon oxynitride, aluminum, aluminum oxide, aluminum nitride, aluminum oxynitride, and a compound semiconductor. The first member 10 may be, for example, quartz.

The second member 20 includes, for example, a resin. The second member 20 may include, for example, at least one selected from the group consisting of an acrylic group, a ketone group, and an amino group. The second member 20 may be, for example, a compound including silicon (e.g., a siloxane-based polymer) or a compound including an acrylate.

Multiple second members 20 are provided in the example. The multiple second members 20 are arranged along a first direction.

The first direction is taken as an X-axis direction. One direction perpendicular to the X-axis direction is taken as a Z-axis direction. A direction perpendicular to the X-axis direction and the Z-axis direction is taken as a Y-axis direction.

For example, the second member 20 may have a stripe configuration extending in the Y-axis direction.

The processing body 18 includes a surface 18F. The surface 18F includes a surface 18Fa of the first member 10, and a surface 18Fb of the second member 20.

As shown in FIG. 2, first processing of the processing body 18 is performed (step S110). In the first processing, for example, at least a part of the processing body 18 is caused to be hydrophobic. In the first processing, for example, at least a part of the surface 18Fa of the first member 10 is caused to be hydrophobic.

Figure 1B:
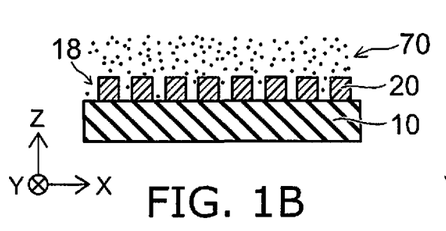

For example, as shown in FIG. 1B, the first processing of the processing body 18 is performed by using a compound 70. The compound 70 includes, for example, fluorine. The compound 70 includes an alkoxysilane compound including fluorine. The compound 70 may include, for example, a silane coupling agent including a group including fluorine. The compound 70 may include, for example, a silane coupling agent (an alkoxysilane compound) including a reactive group. The reactive group includes, for example, at least one of an aromatic group, a cyclic hydrocarbon group, or an alkyl group. The compound 70 may include, for example, fluorocarbon. The compound 70 may include a polymer including fluorine.

The compound 70 may include, for example, at least one selected from the group consisting of alkyldisilazane, and alkylchlorosilane.

In the first processing (step S110), in the case where the compound 70 is a gas, the processing body 18 is caused to contact the gas. In the case where the compound 70 is a liquid, the processing body 18 is caused to contact the liquid. A solution that includes the compound 70 may be coated onto the processing body 18. As described below, a film that includes the compound 70 may be formed by heating after coating; and subsequently, cleaning may be performed.

At least a part of the surface 18F of the processing body 18 is hydrophobic after the first processing. For example, at least a part of the surface 18Fa is hydrophobic after the first processing As shown in FIG. 2, second processing is performed after the first processing (step S120).

Figure 1C:
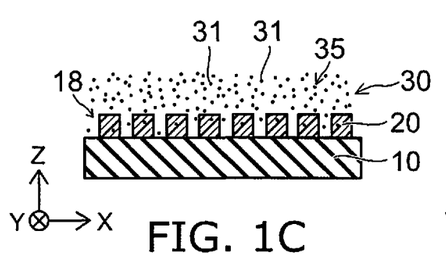

For example, as shown in FIG. 1C, the processing body 18 is caused to contact an atmosphere 30 including a metal compound 35. In the second processing, for example, the processing body 18 (the second member 20 and another portion of the first member 10) is caused to contact at least one of a liquid including the metal compound 35 or a gas including the metal compound 35.

The metal compound 35 may include, for example, a metal complex including the metallic element 31. The metal compound 35 may include, for example, at least one selected from the group consisting of aluminum, zinc, titanium, and tungsten. The metal compound 35 may include, for example, trimethyl aluminum.

The metal compound 35 (or the metallic element 31) is introduced to the second member 20 by the second processing.

At this time, the surface of the processing body 18 is caused to be hydrophobic by the first processing. The surface 18Fa of the first member 10 is caused to be hydrophobic by the first processing. Therefore, the metal compound 35 (or the metallic element 31) does not adhere easily to the surface of the processing body 18. For example, the metal compound 35 (or the metallic element 31) does not adhere easily to the surface of the other portion (the exposed portion) of the first member 10. Also, the metal compound 35 (or the metallic element 31) does not adhere easily to the surface of the second member 20 as well.

It is preferable that the second member 20 is relatively porous compared to the first member 10. Therefore, the metal compound 35 (or the metallic element 31) can enter the second member 20. On the other hand, it is preferable that the first member 10 is dense compared to the second member 20. For example, silicon oxide may be used as the first member 10, and resin containing an acryl group as the second member 20 may be used. Therefore, the metal compound 35 (or the metallic element 31) does not easily enter the first member 10.

Thus, by performing the second processing after the first processing recited above, the metal compound 35 (or the metallic element 31) is selectively introduced to the second member 20.

As shown in FIG. 2, third processing (step S130) is performed after the second processing (step S120).

Figure 1D:
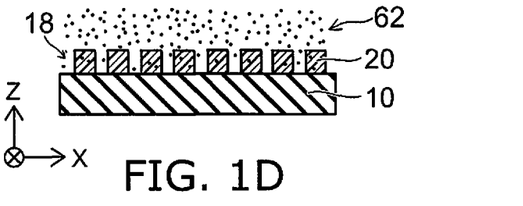

As shown in FIG. 1D, in the third processing, the processing body 18 is processed in an atmosphere 62 including at least one selected from the group consisting of water, oxygen, and ozone. The third processing is, for example, oxidation treatment.

Figure 1E:
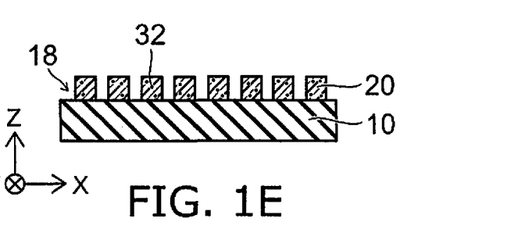

After the third processing as shown in FIG. 1E, the second member 20 includes, for example, an oxide 32 including the metallic element 31. At this time, the oxide 32 is not formed at the surface of the other portion (the exposed portion) of the first member 10 because the metal compound 35 (or the metallic element 31) does not adhere to the surface of the other portion (the exposed portion) of the first member 10.

Thus, the metallic element 31 is introduced to the second member 20; and the etching resistance of the second member 20 improves. On the other hand, the other portion (the exposed portion) of the first member 10 substantially is not affected based on the metallic element 31. In other words, the etching characteristics of the other portion (the exposed portion) of the first member 10 substantially do not change.

Figure 1F:
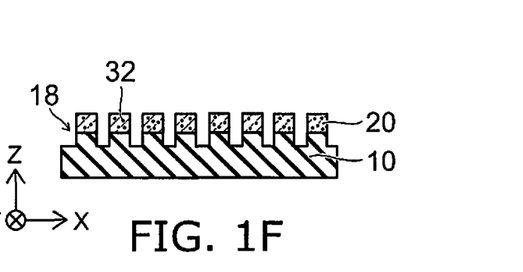

After the third processing (step S130) as shown in FIG. 2 and FIG. 1F, at least a portion of the other portion of the first member 10 is removed using the second member 20 as a mask (step S140).

In step S140, an etchant that matches the characteristics of the first member 10 and the second member 20 is used. For example, dry etching is performed. For example, in the removal (the etching), the other portion (the exposed portion) of the first member 10 recited above is caused to contact a gas including at least one selected from the group consisting of fluorine, chlorine, and carbon. Thereby, a portion of the first member 10 (the portion not covered with the second member 20) is removed.

According to experiments of the inventor, it was found that in the case where steps S120 to S140 are performed without performing step S110 recited above (e.g., the hydrophobic treatment), the first member 10 that is not covered with the second member 20 is not etched easily and undesirably remains. It is considered that this is because the metallic element 31 adheres to the surface of the first member 10 not covered with the second member 20 in the second processing and the third processing, becomes, for example, an oxide, and changes the etching characteristics.

For example, a thin film that includes the metallic element 31 is formed at the surface of the first member 10 not covered with the second member 20; and the first member 10 is not etched easily due to the thin film.

Conversely, in the embodiment, step S110 (the first processing, e.g., causing to be hydrophobic) is performed before step S120 (the second processing). Thereby, the metal compound 35 (or the metallic element 31) does not adhere easily to the surface of the other portion (the exposed portion) of the first member 10. For example, a thin film that includes the metallic element 31 is not formed easily. On the other hand, the metal compound 35 (or the metallic element 31) is introduced to the second member 20. Thus, in the embodiment, the metallic element is introduced selectively to the second member 20; and as a result, the etching resistance of the second member 20 selectively improves.

By selectively improving the etching resistance of the second member 20, the accuracy of the etching increases. According to the embodiment, a pattern formation method can be provided in which the accuracy can be increased.

Figure 3:
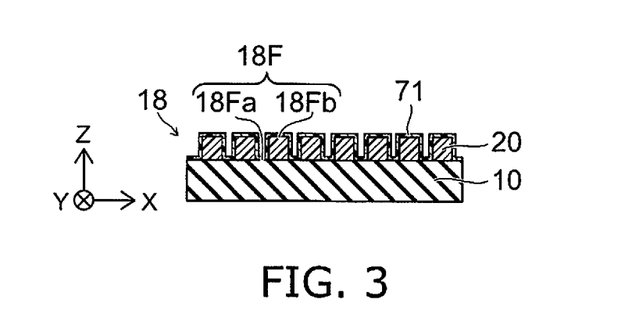
FIG. 3 is a schematic cross-sectional view illustrating a portion of the pattern formation method according to the first embodiment.

FIG. 3 is a schematic cross-sectional view illustrating a portion of the pattern formation method according to the first embodiment. FIG. 3 shows one example of the first processing (step S110). As shown in FIG. 3, a film 71 that includes the compound 70 (referring to FIG. 1B) is formed at the processing body 18. In such a case, for example, the compound 70 is at least one of a liquid including fluorine or a liquid including polystyrene or the like. The liquid is coated onto the processing body 18 and subsequently heated. Thereby, the film 71 that includes the compound 70 is formed. Subsequently, cleaning is performed as necessary. The film 71 is thin. At least a part of the surface 18F of the processing body 18 becomes hydrophobic due to the film 71. At least a part of the surface 18Fa the first member 10 becomes hydrophobic due to the film 71. The first processing may be performed by such a method.

Second Embodiment

In a second embodiment, the second member 20 is formed by a method using a block copolymer. After the formation of the second member 20, the method described in reference to the first embodiment may be performed.

Figure 4:
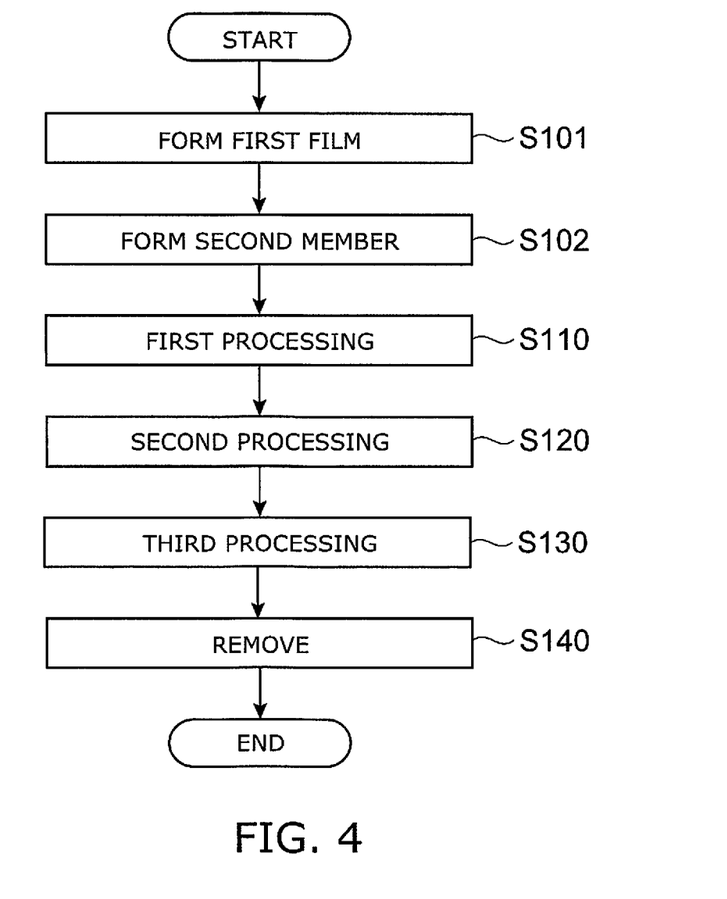
FIG. 4 is a flowchart illustrating a pattern formation method according to a second embodiment.

FIG. 4 is a flowchart illustrating the pattern formation method according to the second embodiment. FIG. 5A to FIG. 5F are schematic cross-sectional views illustrating the pattern formation method according to the second embodiment.

As shown in FIG. 4, before the first processing (step S110), a first film is formed at a structure body described below (step S101); and the second member 20 is formed (step S102). An example of step S101 and step S102 will now be described. In the following example, the second member 20 is formed by a method using a block copolymer. Also, a physical guide (a structure body) is used in the method using the block copolymer.

First, an example of the method for forming the structure body will be described. In the following example, the structure body is formed by imprinting.

Figure 5A:
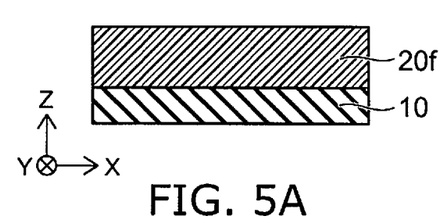
FIG. 5A to FIG. 5F are schematic cross-sectional views illustrating the pattern formation method according to the second embodiment.

As shown in FIG. 5A, a resin liquid film 20f is formed at the first member 10. A portion of the resin liquid film 20f is used to form the second member 20. The resin liquid film 20f has a liquid form. For example, the resin liquid film 20f is formed by coating.

Figure 5B:
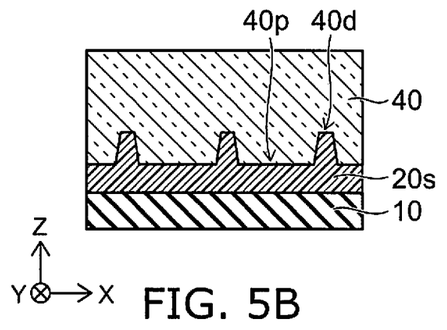

As shown in FIG. 5B, a structure body 20s is obtained by causing a template 40 to contact the resin liquid film 20f. The surface of the template 40 includes a template protrusion 40p and a template recess 40d. The surface of the resin liquid film 20f conforms to the shape of the template protrusion 40p and the template recess 40d. The resin liquid film 20f is solidified in this state. For example, at least one of heating or irradiating light is performed. Thereby, the structure body 20s is obtained. Subsequently, the template 40 is released from the structure body 20s.

Figure 5C:
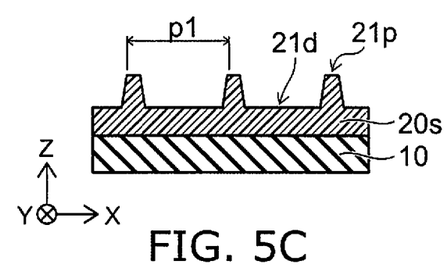

As shown in FIG. 5C, the structure body 20s includes a protrusion 21p and a recess 21d. The protrusion 21p corresponds to the template recess 40d. The recess 21d corresponds to the template protrusion 40p.

For example, multiple protrusions 21p are provided. The multiple protrusions 21p are arranged along the X-axis direction at a first pitch p1. For example, the multiple protrusions 21p have band configurations extending along the Y-axis direction.

An example of the method for obtaining the second member 20 using the structure body 20s and the block copolymer will now be described.

Figure 5D:
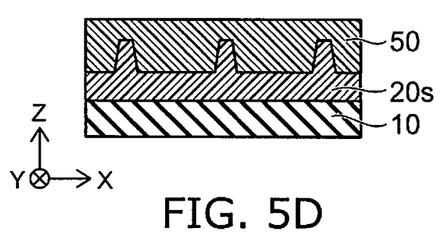

As shown in FIG. 5D, the structure body 20s is provided at the first member 10. The first film 50 is formed at the structure body 20s. For example, as shown in FIG. 5D, a liquid that is used to form the first film 50 is coated. For example, the coating is performed by spin coating, drop casting, or inkjet.

Figure 5E:
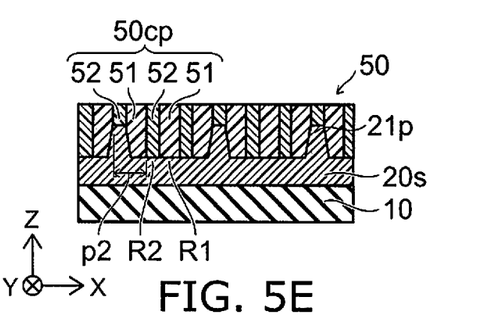

As shown in FIG. 5E, the first film 50 includes a block copolymer 50cp. The block copolymer 50cp includes multiple first portions 51 and multiple second portions 52. For example, after coating the first film 50 on the structure body 20s, phase separation of the first film 50 is caused by heating, etc. The phase separation is performed by self assembly. Thereby, the multiple first portions 51 and the multiple second portions 52 are arranged. At this time, the protrusions 21p of the structure body 20s function as a physical guide.

As shown in FIG. 5E, the structure body 20s includes multiple first regions R1 and multiple second regions R2. The regions that are positioned under the multiple first portions 51 are the first regions R1. The regions that are positioned under the multiple second portions 52 are the second regions R2. Thus, the multiple first regions R1 overlap the multiple first portions 51. The multiple second regions R2 overlap the multiple second portions 52.

For example, the multiple first portions 51 include styrene; and the multiple second portions 52 include a carbonyl group. For example, the multiple first portions 51 include polystyrene (PS). For example, the multiple second portions 52 include polymethyl methacrylate (PMMA).

For example, the multiple first portions 51 are arranged at a second pitch p2. The multiple second portions 52 are arranged at the second pitch p2. The multiple first regions R1 are arranged at the second pitch p2. The multiple second regions R2 are arranged at the second pitch p2. The second pitch p2 is smaller than the first pitch p1. The first pitch p1 is, for example, substantially an integer multiple of (an integer multiple not less than 2 times) the second pitch p2.

Figure 5F:
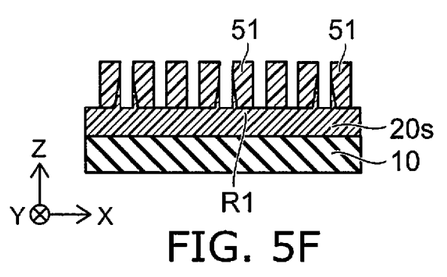

The multiple second portions 52 are removed as shown in FIG. 5F. For the etchant used in the removal, the etching rate of the etchant for the multiple first portions 51 is different from the etching rate of the etchant for the multiple second portions 52. The multiple second portions 52 are selectively removed by etching using such an etchant (e.g., a gas including oxygen). The multiple first portions 51 remain.

By continuing the etching further, the region of the structure body 20s not covered with the multiple first portions 51 is removed. As a result, the region (the multiple first regions R1) of the structure body 20s covered with the multiple first portions 51 remains. Thus, the second member 20 is obtained from the multiple first regions R1 (referring to FIG. 1A).

Thus, in the method recited above, the first film 50 is formed, before the first processing, at the structure body 20s provided at the first member 10 (step S101: referring to FIG. 4). The first film 50 includes the block copolymer 50cp including the multiple first portions 51 and the multiple second portions 52. The structure body 20s includes the multiple first regions R1 and the multiple second regions R2. The multiple first regions R1 overlap the multiple first portions 51. The multiple second regions R2 overlap the multiple second portions 52. Further, the second member 20 is obtained from the multiple first regions R1 by removing the multiple second portions 52 and the multiple second regions R2 (step S102: referring to FIG. 4).

In the embodiment, the structure body 20s includes, for example, at least one selected from the group consisting of an acrylic group, a ketone group, and an amino group.

The structure body 20s includes the multiple protrusions 21p. At least one of the multiple first regions R1 and at least one of the multiple second regions R2 are positioned between the multiple protrusions 21p (at the recess 21d). For example, a pair that includes one of the multiple first regions R1 and one of the multiple second regions R2 is positioned between the multiple protrusions 21p. Multiple pairs may be positioned between the multiple protrusions 21p.

For example, as shown in FIG. 5E, for example, at least one of the multiple second portions 52 overlaps one of the multiple protrusions 21p.

Figure 6:
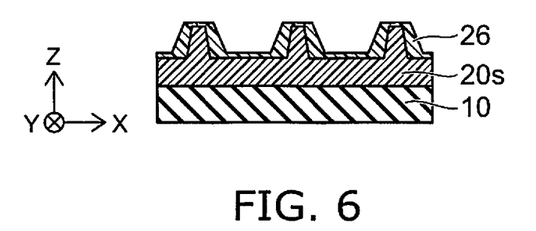
FIG. 6 is a schematic cross-sectional view illustrating a portion of the pattern formation method according to the second embodiment.

FIG. 6 is a schematic cross-sectional view illustrating a portion of the pattern formation method according to the second embodiment. As shown in FIG. 6, an intermediate film 26 may be formed at the structure body 20s. The formation of the intermediate film 26 is performed before the formation of the first film 50 (referring to FIG. 5A). The surface energy of the intermediate film 26 is between the surface energy of the multiple first portions 51 and the surface energy of the multiple second portions 52.

The formation of the intermediate film 26 includes, for example, performing neutralization processing of the surface of the structure body 20s. For example, the intermediate film 26 is formed at the surface of the structure body 20s by the neutralization processing.

For example, self assembly is performed more reliably due to the intermediate film 26. For example, the thickness of the intermediate film 26 on the protrusions 21p of the structure body 20s may be thinner than the thickness of the intermediate film 26 on the recesses 21d of the structure body 20s.

The embodiments may include the following configurations (e.g., technological proposals).

Configuration 1

A pattern formation method, comprising:

performing a first processing of causing a surface of a first member of a processing body to be hydrophobic, the processing body including the first member and a second member, the second member being provided at a portion of the first member;

performing a second processing of causing the processing body to contact an atmosphere including a metal compound, the second processing being after the first processing;

performing a third processing of processing the processing body in an atmosphere including at least one selected from the group consisting of water, oxygen, and ozone, the third processing being after the second processing; and removing, after the third processing, at least a portion of another portion of the first member by using the second member as a mask.

Configuration 2

A pattern formation method, comprising:

performing a first processing of a processing body by using a compound including fluorine, the processing body including a first member and a second member, the second member being provided at a portion of the first member;

performing a second processing of causing the processing body to contact an atmosphere including a metal compound, the second processing being after the first processing;

performing a third processing of performing processing in an atmosphere including at least one selected from the group consisting of water, oxygen, and ozone, the third processing being after the second processing; and removing, after the third processing, at least a portion of another portion of the first member by using the second member as a mask.

Configuration 3

The pattern formation method according to Configuration 2, wherein the compound including the fluorine includes an alkoxysilane compound including at least one of fluorine, an aromatic group, a cyclic hydrocarbon group, or an alkyl group.

Configuration 4

The pattern formation method according to Configuration 2, wherein the compound including the fluorocarbon.

Configuration 5

The pattern formation method according to Configuration 2, wherein the compound including the fluorine includes $CF_4$.

Configuration 6

The pattern formation method according to Configuration 2, wherein the compound including the fluorine includes a polymer including fluorine.

Configuration 7

A pattern formation method, comprising:

performing a first processing of a processing body by using a compound including at least one selected from the group consisting of alkyldisilazane, and alkylchlorosilane, the processing body including a first member and a second member, the second member being provided at a portion of the first member;

performing a second processing of causing the processing body to contact an atmosphere including a metal compound, the second processing being after the first processing;

performing a third processing of performing processing in an atmosphere including at least one selected from the group consisting of water, oxygen, and ozone, the third processing being after the second processing; and removing, after the third processing, at least a portion of another portion of the first member by using the second member as a mask.

Configuration 8

The pattern formation method according to Configuration 7, wherein the alkyldisilazane includes hexamethyldisilazan.

Configuration 9

The pattern formation method according to Configuration 7, wherein the alkyldisilazane includes at least one selected from the group consisting of octyltrichlorosilane, octadecyltrichlorosilane, and β-phenethyltrichrolosilan.

Configuration 10

The pattern formation method according to any one of Configurations 1 to 9, wherein the second processing includes introducing the metallic element to the second member.

Configuration 11

The pattern formation method according to any one of Configurations 1 to 10, wherein the second processing includes causing the processing body to contact including the organo metal or metal chloride.

Configuration 12

The pattern formation method according to any one of Configurations 1 to 9, wherein the metal compound includes a metal complex including the metallic element.

Configuration 13

The pattern formation method according to any one of Configurations 1 to 9, wherein the metal compound includes trimethyl aluminum.

Configuration 14

The pattern formation method according to any one of Configurations 11, wherein the at least one of organo metal or metal chloride includes at least one selected from the group consisting of Ti, V, and W.

Configuration 15

The pattern formation method according to any one of Configurations 1 to 14, wherein the second member after the third processing includes an oxide including the metallic element.

Configuration 16

The pattern formation method according to any one of Configurations 1 to 15, wherein the removing includes causing the other portion of the first member to contact a gas including at least one selected from the group consisting of fluorine, chlorine, and carbon.

Configuration 17

The pattern formation method according to any one of Configurations 1 to 16, wherein
the first member includes at least one selected from the group consisting of silicon oxide, silicon nitride, silicon oxynitride, aluminum oxide, aluminum nitride, aluminum oxynitride, silicon, aluminum, and a compound semiconductor, and
the second member includes a resin.

Configuration 18

The pattern formation method according to any one of Configurations 1 to 14, wherein the second member includes at least one selected from the group consisting of an acrylic group, a ketone group, and an amino group.

Configuration 19

The pattern formation method according to any one of Configurations 1 to 16, further comprising:
forming, before the first processing, a first film at a structure body provided at the first member, the first film including a block copolymer including multiple first portions and multiple second portions, the structure body including multiple first regions and multiple second regions, the multiple first regions overlapping the multiple first portions, the multiple second regions overlapping the multiple second portions; and
obtaining the second member from the multiple first regions by removing the multiple second portions and the multiple second regions.

Configuration 20

The pattern formation method according to Configuration 19, wherein
the multiple first portions include styrene, and
the multiple second portions include a carbonyl group.

Configuration 21

The pattern formation method according to Configuration 19 or 20, wherein the structure body includes at least one selected from the group consisting of an acrylic group, a ketone group, and an amino group.

Configuration 22

The pattern formation method according to any one of Configurations 19 to 21, wherein
the structure body includes multiple protrusions, and
at least one of the multiple first regions and at least one of the multiple second regions are positioned between the multiple protrusions.

Configuration 23

The pattern formation method according to Configuration 22, wherein at least one of the multiple second portions overlaps one of the multiple protrusions.

According to the embodiments, a pattern formation method can be provided in which the accuracy can be increased.

Hereinabove, exemplary embodiments of the invention are described with reference to specific examples. However, the embodiments of the invention are not limited to these specific examples. For example, one skilled in the art may similarly practice the invention by appropriately selecting specific configurations of first members, second members, structure bodies, first films, and block copolymers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all pattern formation methods practicable by an appropriate design modification by one skilled in the art based on the pattern formation methods described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A pattern formation method, comprising:
    forming a first layer;
    forming a patterned layer on the first layer, the patterned layer including an opening from which a surface of the first layer being exposed;
    preforming a hydrophobic treatment of a surface of the patterned layer and the exposed surface of the first layer;
    contacting a metal compound to the surface of the patterned layer and the exposed surface of the first layer after the hydrophobic treatment, the metal compound being introduced to the patterned layer; and
    processing the first layer by using the patterned layer as a mask.

2. The method according to claim 1, wherein the metal compound includes trimethyl aluminum.

3. The method according to claim 1, wherein the removing includes causing the other portion of the first member to contact a gas including at least one selected from the group consisting of fluorine, chlorine, and carbon.

4. The method according to claim 1, wherein
a material of the first layer includes at least one selected from the group consisting of silicon oxide, silicon nitride, silicon oxynitride, aluminum oxide, aluminum nitride, aluminum oxynitride, silicon, aluminum, and a compound semiconductor, and
a material of the patterned layer includes a resin.

5. The method according to claim 1, wherein a material of the patterned layer includes at least one selected from the group consisting of an acrylic group, a ketone group, and an amino group.

6. The method according to claim 1, wherein the metal compound includes at least one of organo metal or metal chloride.

7. The method according to claim 6, wherein the at least one of organo metal or metal chloride includes at least one selected from the group consisting of Ti, V, and W.

8. The method according to claim 1, wherein the hydrophobic treatment is performed by contacting a compound including at least one selected from the group consisting of alkyldisilazane, and alkylchlorosilane.

9. The method according to claim 8, wherein the alkyldisilazane includes hexamethyldisilazane.

10. The method according to claim 8, wherein the alkylchlorosilane includes at least one selected from the group consisting of octyltrichlorosilane, octadecyltrichlorosilane, and β-phenethyltrichrolosilan.

11. The method according to claim 1, wherein
the hydrophobic treatment is performed by contacting a compound including fluorine.

12. The method according to claim 11, wherein the compound including the fluorine includes an alkoxysilane compound including at least one of fluorine, an aromatic group, a cyclic hydrocarbon group, or an alkyl group.

13. The method according to claim 11, wherein the compound including the fluorocarbon.

14. The method according to claim 13, wherein the fluorocarbon including the fluorine includes $CF_4$.

15. The method according to claim 1, wherein the process of forming the patterned layer further comprises:

forming a first film at a structure body provided at the first layer, the first film including a block copolymer including a plurality of first portions and a plurality of second portions, the structure body including a plurality of first regions and a plurality of second regions, the first regions overlapping the first portions, the second regions overlapping the second portions; and
obtaining the patterned layer from the first regions by removing the second portions and the second regions.

16. The method according to claim 15, wherein
the first portions includes styrene, and
the second portions includes a carbonyl group.

17. The method according to claim 15, wherein the structure body includes at least one selected from the group consisting of an acrylic group, a ketone group, and an amino group.

18. The method according to claim 15, wherein
the structure body includes a plurality of protrusions, and
at least one of the first regions and at least one of the second regions are positioned between the protrusions.

19. The method according to claim 18, wherein at least one of the second portions overlaps one of the protrusions.

20. The method according to claim 1, further comprising:
contacting an oxidant including at least one selected from the group consisting of water, oxygen, and ozone to the patterned layer, after contacting the metal compound to the patterned layer.

21. A semiconductor device manufacturing method, comprising:
providing a first layer;
forming a patterned layer on the first layer, the patterned layer including an opening from which a surface of the first layer being exposed;
preforming a hydrophobic treatment of a surface of the patterned layer and the exposed surface of the first layer;
contacting a metal compound to the surface of the patterned layer and the exposed surface of the first layer after the hydrophobic treatment, the metal compound being introduced to the patterned layer; and
processing the first layer by using the patterned layer as a mask.

* * * * *